United States Patent
Hinode et al.

(10) Patent No.: US 9,543,162 B2
(45) Date of Patent: Jan. 10, 2017

(54) SUBSTRATE PROCESSING METHOD

(71) Applicant: SCREEN Holdings Co., Ltd., Kyoto (JP)

(72) Inventors: Taiki Hinode, Kyoto (JP); Takashi Ota, Kyoto (JP); Kazuhide Saito, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/824,427

(22) Filed: Aug. 12, 2015

(65) Prior Publication Data

US 2016/0049308 A1 Feb. 18, 2016

(30) Foreign Application Priority Data

Aug. 14, 2014 (JP) .................................. 2014-165258

(51) Int. Cl.
| | | |
|---|---|---|
| *C03C 15/00* | (2006.01) | |
| *H01L 21/311* | (2006.01) | |
| *H01L 21/67* | (2006.01) | |

(52) U.S. Cl.
CPC .... *H01L 21/31111* (2013.01); *H01L 21/67028* (2013.01)

(58) Field of Classification Search
CPC .. H01L 21/3111; H01L 21/311; H01L 21/306; H01L 21/308
USPC .................................................... 216/83, 93
See application file for complete search history.

(56) References Cited

U.S. PATENT DOCUMENTS

| | | | | |
|---|---|---|---|---|
| 8,062,955 B2* | 11/2011 | Tanaka | ................ | C23C 18/1689 438/437 |
| 8,883,026 B2* | 11/2014 | Ota | ........................ | B44C 1/227 156/345.15 |
| 2012/0074102 A1 | 3/2012 | Magara et al. | .................. | 216/83 |
| 2014/0231013 A1* | 8/2014 | Hinode | .................. | C09K 13/04 156/345.23 |

FOREIGN PATENT DOCUMENTS

| | | |
|---|---|---|
| JP | 2012-074601 | 4/2012 |
| TW | 201421563 A | 6/2014 |

* cited by examiner

*Primary Examiner* — Duy Deo
*Assistant Examiner* — Maki Angadi
(74) *Attorney, Agent, or Firm* — Ostrolenk Faber LLP

(57) ABSTRACT

A substrate processing method includes a phosphoric acid processing step of supplying a phosphoric acid aqueous solution, which contains silicon and has a silicon concentration lower than a saturation concentration, to a front surface of a substrate, a liquid volume reducing step of reducing a volume of the phosphoric acid aqueous solution on the substrate, after the phosphoric acid processing step, and a rinse replacing step of supplying a rinse liquid having a temperature lower than that of the phosphoric acid aqueous solution supplied to the front surface of the substrate in the phosphoric acid processing step to the front surface of the substrate covered with the phosphoric acid aqueous solution at least partially, after the liquid volume reducing step.

7 Claims, 6 Drawing Sheets

SUPPLYING OF PHOSPHORIC ACID

REDUCTION OF LIQUID VOLUME

SUPPLYING OF RINSE LIQUID

|  | Phosphoric acid processing step | Liquid volume reducing step | Rinse replacing step |
|---|---|---|---|
| Volume of liquid on the substrate (cc) | 12.7 | 2.0 | 13.2 |
| Temperature of liquid on the substrate (°C) | 170 | 120 | 25 |
| Remaining amount of Si(g) |  | 0.0001296 |  |
| Concentration of Si (ppm) | 40 | 40 | 7.883 |

NUMBER OF PARTICLES NOT LESS THAN 32nm
: 33 PARTICLES

| Temperature (°C) | Si saturation concentration (ppm) |
|---|---|
| Room temperature | 7.5 |
| 30 | 10 |
| 40 | 12 |
| 80 | 20 |
| 90 | 25 |
| 100 | 30 |
| 120 | 37 |
| 160 | 120 |

SUBSTRATE PROCESSING METHOD

BACKGROUND OF THE INVENTION

1. Field of the Invention

The present invention relates to a substrate processing method for processing a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

In a process of manufacturing semiconductor devices and liquid crystal display devices, etching treatment is performed as necessary by supplying a high-temperature phosphoric acid aqueous solution as an etchant onto the front surface of a substrate, having a silicon nitride film (SiN) and a silicon oxide film ($SiO_2$) formed thereon, to selectively etch the silicon nitride film. Japanese Patent Application Publication No. 2012-074601 discloses that a phosphoric acid aqueous solution close to the boiling point is supplied to a substrate held by a spin chuck and the phosphoric acid aqueous solution on the substrate is thereafter rinsed off by pure water.

The phosphoric acid aqueous solution that is supplied to the substrate ordinarily contains silicon. If the concentration of silicon is within an appropriate range, the etching selectivity ((etching amount of the silicon nitride film)/(etching amount of the silicon oxide film)) is increased. However, when pure water at room temperature is supplied to the substrate after the high-temperature phosphoric acid aqueous solution has been supplied, the temperature of the phosphoric acid aqueous solution on the substrate decreases and the saturation concentration of silicon decreases. The concentration of silicon in the phosphoric acid aqueous solution thus becomes not less than the saturation concentration and silicon precipitates from the phosphoric acid aqueous solution. Precipitated matter that includes the silicon remains on the upper surface of the substrate, thereby contaminating the substrate.

SUMMARY OF THE INVENTION

An object of the present invention is to reduce the amount of precipitated matter that precipitates from a phosphoric acid aqueous solution when the phosphoric acid aqueous solution is rinsed off by a rinse liquid.

A preferred embodiment of the present invention provides a substrate processing method including a phosphoric acid processing step, which includes a step of supplying a phosphoric acid aqueous solution that contains silicon to a front surface of a substrate and in which the front surface of the substrate is processed while a liquid film of the phosphoric acid aqueous solution, having a silicon concentration lower than the saturation concentration of silicon, is formed on the front surface of the substrate, a liquid volume reducing step of reducing the volume of the phosphoric acid aqueous solution on the substrate after the phosphoric acid processing step, and a rinse replacing step of supplying the front surface of the substrate with a rinse liquid of lower temperature than the liquid film of the phosphoric acid aqueous solution formed on the front surface of the substrate in the phosphoric acid processing step and replacing the phosphoric acid aqueous solution on the front surface of the substrate with the rinse liquid after the liquid volume reducing step.

With this method, the front surface of the substrate is processed while the liquid film is formed on the front surface of the substrate by the phosphoric acid aqueous solution having the silicon concentration lower than the saturation concentration of silicon. The phosphoric acid aqueous solution is thereafter expelled from the substrate. The volume of the phosphoric acid aqueous solution on the substrate is thereby reduced. Therefore the amount of silicon remaining on the front surface of the substrate is also reduced. The rinse liquid is supplied to the front surface of the substrate after the volume of the phosphoric acid aqueous solution on the substrate has been reduced. The phosphoric acid aqueous solution on the front surface of the substrate is thereby replaced with the rinse liquid.

When in the state where the liquid film of the phosphoric acid aqueous solution is formed on the front surface of the substrate, a rinse liquid of lower temperature than the phosphoric acid aqueous solution of the liquid film is supplied to the substrate, the temperature of the phosphoric acid aqueous solution of the liquid film on the substrate decreases. The concentration of silicon in the phosphoric acid aqueous solution liquid film may thus become not less than the saturation concentration and a portion of the silicon contained in the phosphoric acid aqueous solution may precipitate. However, the amount of silicon contained in the phosphoric acid aqueous solution on the substrate is reduced before the supplying of the rinse liquid and therefore even if silicon precipitates, the total amount thereof is reduced. Contamination of the substrate by precipitated matter that includes silicon can thus be suppressed or prevented.

The temperature of the rinse liquid supplied to the front surface of the substrate in the rinse replacing step may be lower than that of the phosphoric acid aqueous solution liquid film formed on the substrate front surface in the phosphoric acid processing step and higher than room temperature.

With this method, the rinse liquid of higher temperature than room temperature is supplied to the phosphoric acid aqueous solution liquid film on the substrate front surface. When in the state where the phosphoric acid aqueous solution liquid film is formed on the substrate front surface, a rinse liquid of lower temperature than the phosphoric acid aqueous solution liquid film is supplied to the substrate, the temperature of the phosphoric acid aqueous solution on the substrate decreases. However, the temperature of the rinse liquid is higher than room temperature and therefore the amount of temperature decrease of the phosphoric acid aqueous solution is reduced. The amount of decrease of the saturation concentration of silicon in the phosphoric acid aqueous solution is thereby reduced and the precipitation of silicon from the phosphoric acid aqueous solution due to the supplying of the rinse liquid can thus be suppressed or prevented.

The substrate processing method may further include a first concentration maintaining step of maintaining the concentration of silicon in the phosphoric acid aqueous solution liquid film on the substrate at a concentration lower than the saturation concentration until the liquid volume reducing step ends.

With this method, the substrate front surface is processed while forming the phosphoric acid aqueous solution liquid film, having the silicon concentration lower than the saturation concentration, on the substrate front surface. Thereafter, the phosphoric acid aqueous solution is expelled from the substrate. The concentration of silicon in the phosphoric acid aqueous solution liquid film on the substrate is maintained lower than the saturation concentration from the point at which the supplying of the phosphoric acid aqueous solution is started to the point at which the expelling of the phosphoric acid aqueous solution ends. Contamination of the substrate due to precipitation of silicon can thus be suppressed or prevented during this period.

In a case where the phosphoric acid aqueous solution is expelled from the substrate by rotating the substrate around a vertical line passing through the substrate, the temperature of the phosphoric acid aqueous solution on the substrate decreases due to the rotation of the substrate. In this case, the first concentration maintaining step may include a step of rotating the substrate at a rotation speed at which the concentration of silicon in the phosphoric acid aqueous solution liquid film on the substrate is maintained lower than the saturation concentration. The first concentration maintaining step may include a step of supplying, to the substrate front surface, the phosphoric acid aqueous solution of a temperature such that the concentration of silicon in the phosphoric acid aqueous solution liquid film does not become not less than the saturation concentration of silicon even if the saturation concentration of silicon is decreased due to temperature decrease of the phosphoric acid aqueous solution.

The substrate processing method may further include a second concentration maintaining step of maintaining the concentration of silicon contained in the liquid on the substrate at a concentration lower than the saturated concentration until the supplying of the rinse liquid ends in the rinse replacing step.

With this method, the substrate front surface is processed while forming the phosphoric acid aqueous solution liquid film, having the silicon concentration lower than the saturation concentration, on the substrate front surface. The rinse liquid is supplied to the substrate front surface after the volume of the phosphoric acid aqueous solution on the substrate has been reduced. The concentration of silicon in the phosphoric acid aqueous solution liquid film on the substrate is maintained lower than the saturation concentration during the phosphoric acid processing step and until the supplying of the rinse liquid ends. Contamination of the substrate due to precipitation of silicon can thus be suppressed or prevented during this period.

The second concentration maintaining step may include at least one of a step of supplying, to the substrate front surface, the rinse liquid of a temperature such that the concentration of silicon in the liquid on the substrate is maintained lower than the saturated concentration until the supplying of the rinse liquid ends in the rinse replacing step and a step of supplying, to the substrate front surface, a phosphoric acid aqueous solution containing silicon at a concentration such that the concentration of silicon in the liquid on the substrate is maintained lower than the saturated concentration until the supplying of the rinse liquid ends in the rinse replacing step The phosphoric acid processing step may include a step of supplying the phosphoric acid aqueous solution to the substrate front surface to form the phosphoric acid aqueous solution liquid film to cover the entire substrate front surface. The liquid volume reducing step may be a step of reducing the volume of the phosphoric acid aqueous solution on the substrate while maintaining the phosphoric acid aqueous solution liquid film that covers the entire substrate front surface.

With this method, the phosphoric acid aqueous solution liquid film that covers the entire substrate front surface is formed. Thereafter, the state in which the entire substrate front surface is covered with the phosphoric acid aqueous solution is maintained until the expelling of the phosphoric acid aqueous solution ends. That is, When the phosphoric acid aqueous solution liquid film that covers the entire substrate front surface becomes reduced in thickness and a portion of the substrate front surface becomes exposed, particles become attached readily and a processing fault, such as forming of a watermark, etc., may occur on the substrate. Therefore by maintaining the state in which the entire substrate front surface is covered with the phosphoric acid aqueous solution, the occurrence of a processing defect can be suppressed or prevented.

The substrate processing method may further include a pre-wetting step of supplying a pre-wetting liquid to the substrate front surface before the phosphoric acid processing step. The phosphoric acid processing step may include a step of supplying the phosphoric acid aqueous solution to the substrate front surface that is at least partially covered with the pre-wetting liquid.

If the temperature of the substrate is lower than the temperature of the phosphoric acid aqueous solution, the phosphoric acid aqueous solution that lands on the substrate at the start of supplying of the phosphoric acid aqueous solution is decreased in temperature. After some time elapses, the substrate warms up and the amount of temperature decrease of the phosphoric acid aqueous solution decreases. With the present method, the phosphoric acid aqueous solution is supplied to the substrate front surface that is covered with the pre-wetting liquid. The phosphoric acid aqueous solution becomes mixed with the pre-wetting liquid on the substrate. That is, the phosphoric acid aqueous solution that lands on the substrate at the start of supplying of the phosphoric acid aqueous solution is diluted by the pre-wetting liquid. The concentration of silicon is thereby decreased. Therefore, even if the saturation concentration of silicon decreases due to temperature decrease of the phosphoric acid aqueous solution, the concentration of silicon is unlikely to become not less than the saturation concentration. The precipitation of silicon can thus be suppressed or prevented. Or, the amount of precipitation of silicon can be reduced.

The temperature of the pre-wetting liquid supplied to the substrate in the pre-wetting step may be higher than room temperature.

With this method, the phosphoric acid aqueous solution is supplied to the substrate front surface that is covered with the pre-wetting liquid of higher temperature than room temperature. The amount of temperature decrease of the phosphoric acid aqueous solution that lands on the substrate at the start of supplying of the phosphoric acid aqueous solution is reduced because the temperature of the pre-wetting liquid is higher than room temperature. The amount of decrease of the saturation concentration of silicon is thereby decreased. The concentration of silicon is thus unlikely to become not less than the saturation concentration.

The phosphoric acid processing step may include a step of supplying the phosphoric acid aqueous solution of a temperature close to the boiling point to the substrate front surface. The boiling point of the rinse liquid supplied to the substrate in the rinse replacing step may be lower than the boiling point of the phosphoric acid aqueous solution supplied to the substrate in the phosphoric acid processing step.

With this method, the phosphoric acid aqueous solution of the temperature close to the boiling point is supplied to the substrate front surface. The boiling point of the phosphoric acid aqueous solution is higher than the boiling point of the rinse liquid, and therefore even if a rinse liquid that is heated close to the boiling point is supplied to the substrate, the temperature of the phosphoric acid aqueous solution on the substrate decreases. Even in this case, the precipitation of silicon can be suppressed or prevented by reducing the volume of the phosphoric acid aqueous solution on the substrate. Or, the precipitation amount of silicon can be reduced. Contamination of the substrate by precipitated matter that includes silicon can thus be suppressed or prevented.

The substrate processing method may further include a heating step of heating the phosphoric acid aqueous solution on the substrate in parallel to the phosphoric acid processing step.

With this method, the phosphoric acid aqueous solution on the substrate can be maintained at a predetermined temperature higher than room temperature. The concentration of silicon can thus be maintained lower than the saturation concentration and a high substrate processing efficiency (high etching rate, etc.) can be maintained.

The foregoing and other objects, features, and advantages of the present invention will become more apparent from the description of preferred embodiments provided below with reference to the accompanying drawings.

DETAILED DESCRIPTION OF THE PREFERRED EMBODIMENTS

Figure 1:
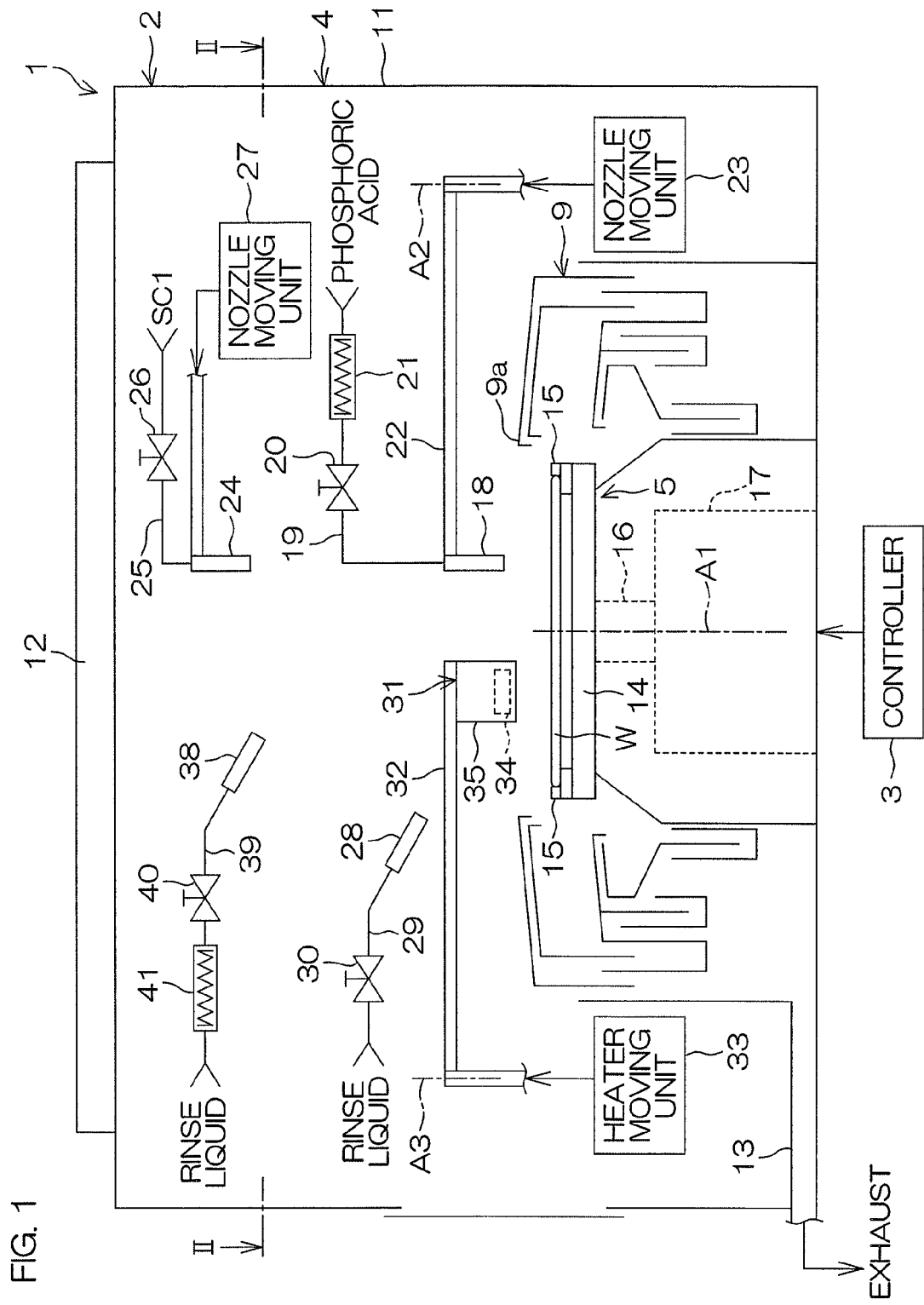
FIG. 1 is a horizontal schematic view of the interior of a processing unit included in a substrate processing apparatus according to a preferred embodiment of the present invention.

FIG. 1 is a horizontal schematic view of the interior of a processing unit 2 included in a substrate processing apparatus 1 according to a preferred embodiment of the present invention.

The substrate processing apparatus 1 is a single substrate processing type apparatus in which a disk-like substrate W, such as a semiconductor wafer, etc., is processed one by one. The substrate processing apparatus 1 includes a processing unit 2 that processes the substrate W using a processing fluid such as a processing liquid or a processing gas, a transfer robot (not shown) that transfers the substrate W to the processing unit 2, and a controller 3 that controls the substrate processing apparatus 1.

As shown in FIG. 1, the processing unit 2 includes a box-shaped chamber 4 having an internal space, a spin chuck 5 that holds the substrate W horizontally within the chamber 4 and rotates the substrate W around a vertical rotation axis A1 passing through the center of the substrate W, a plurality of nozzles supplying processing liquids to the substrate W, a cylindrical cup 9 surrounding the spin chuck 5, and an infrared heater 31 that heats the substrate W.

As shown in FIG. 1, the chamber 4 includes a box-shaped partition wall 11 housing the spin chuck 5, etc., an FFU 12 (fan filter unit 12) as a blower unit that feeds clean air (air filtered by a filter) inside the partition wall 11 through an upper portion of the partition wall 11, and an exhaust duct 13 arranged to expel gas within the chamber 4 through a bottom portion of the cup 9. The FFU 12 is disposed above the partition wall 11. The FFU 12 feeds clean air downward into the chamber 4 through the ceiling of the partition wall 11. The exhaust duct 13 is connected to the bottom portion of the cup 9 and guides gas within the chamber 4 toward an exhaust equipment provided in the factory in which the substrate processing apparatus 1 is installed. Accordingly, a downflow (downward flow) flowing from the upper to lower sides within the chamber 4 is formed by the FFU 12 and the exhaust duct 13. The substrate W is processed with such a downflow being formed within the chamber 4.

As shown in FIG. 1, the spin chuck 5 includes a disk-like spin base 14 held in a horizontal orientation, a plurality of chuck pins 15 holding the substrate W in a horizontal orientation above the spin base 14, a spin shaft 16 extending downward from a central portion of the spin base 14, and a spin motor 17 as a substrate rotating unit that rotates the spin shaft 16 to rotate the substrate W and the spin base 14 around the rotation axis A1. The spin chuck 5 is not limited to be a clamping type chuck with which the plurality of chuck pins 15 are brought into contact with the circumferential end surface of the substrate W, and may also be a vacuum type chuck with which the rear surface (lower surface) of the substrate W, which is a non-device forming surface, is suctioned onto an upper surface of the spin base 14 to hold the substrate W horizontally.

As shown in FIG. 1, the cup 9 is disposed further outward (in a direction away from the rotation axis A1) than the substrate W held by the spin chuck 5. The cup 9 surrounds the spin base 14. When a processing liquid is supplied to the substrate W in a state where the spin chuck 5 is rotating the substrate W, the processing liquid supplied to the substrate W is spun off to a periphery of the substrate W. When the processing liquid is supplied to the substrate W, an upper end portion 9a of the upwardly-open cup 9 is disposed higher than the spin base 14. Accordingly, the processing liquid, such as a chemical liquid or a rinse liquid, etc., that is expelled to the periphery of the substrate W is received by the cup 9. The processing liquid received by the cup 9 is then sent to an unillustrated recovery apparatus or waste liquid disposal apparatus.

As shown in FIG. 1, the processing unit 2 includes a phosphoric acid nozzle 18 that discharges a phosphoric acid aqueous solution toward the substrate W held by the spin chuck 5, a phosphoric acid piping 19 that supplies the phosphoric acid aqueous solution to the phosphoric acid nozzle 18, a phosphoric acid valve 20 that switches between supplying and stopping the supply of the phosphoric acid aqueous solution from the phosphoric acid piping 19 to the phosphoric acid nozzle 18, and a temperature controller 21 for raising the temperature of the phosphoric acid aqueous solution to be supplied to the phosphoric acid nozzle 18 to a temperature higher than room temperature (a predetermined temperature within a range of 20° C. to 30° C.).

When the phosphoric acid valve 20 is opened, the phosphoric acid aqueous solution, the temperature of which is controlled by the temperature controller 21, is supplied from the phosphoric acid piping 19 to the phosphoric acid nozzle 18 and discharged from the phosphoric acid nozzle 18. The temperature controller 21 maintains the temperature of the phosphoric acid aqueous solution at a fixed temperature, for example, within a range of 80° C. to 215° C. The temperature of the phosphoric acid aqueous solution that is controlled by the temperature controller 21 may be the boiling point of the phosphoric acid aqueous solution at its current concentration or a temperature lower than the boiling point.

Figures 7, 8:
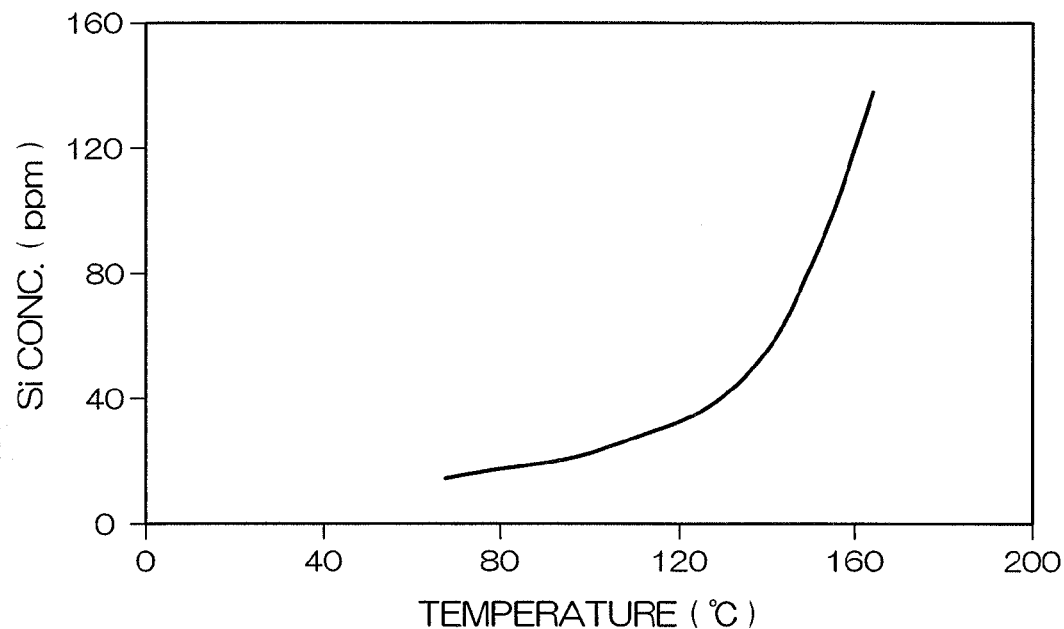
FIG. 7 is a graph of a relationship of the temperature of the phosphoric acid aqueous solution and the concentration of silicon.
FIG. 8 is a table of the relationship of the temperature of the phosphoric acid aqueous solution and the concentration of silicon.

The phosphoric acid aqueous solution is an aqueous solution having phosphoric acid ($H_3PO_4$) as its main component. The concentration of phosphoric acid is, for example, within a range of 50% to 100% and is preferably around 90%. The boiling point of the phosphoric acid aqueous solution differs according to the phosphoric acid concentration and is generally within a range of 140° C. to 195° C. The phosphoric acid aqueous solution contains silicon. The concentration of silicon is, for example, 15 to 150 ppm and is preferably 40 to 60 ppm. The silicon contained in the phosphoric acid aqueous solution may be elemental silicon or a silicon compound or both elemental silicon and a silicon compound. Also, the silicon contained in the phosphoric acid aqueous solution may be silicon that was eluted from the substrate W due to supplying of the phosphoric acid aqueous solution or may be silicon that was added to the phosphoric acid aqueous solution. As can be understood from a saturation concentration curve shown in FIG. 7, the saturation concentration of silicon changes in accordance with the temperature of the phosphoric acid aqueous solution. The concentration of silicon and the temperature of the phosphoric acid aqueous solution are controlled so that the concentration of silicon is lower than the saturation concentration.

As shown in FIG. 1, the processing unit 2 includes a nozzle arm 22 with the phosphoric acid nozzle 18 mounted on a tip portion thereof and a nozzle moving unit 23 that swings the nozzle arm 22 around a swing axis A2, extending in an up/down direction at a periphery of the spin chuck 5, and moving the nozzle arm 22 up and down in a vertical direction along the swing axis A2 to move the phosphoric acid nozzle 18 horizontally and vertically. The nozzle moving unit 23 moves the phosphoric acid nozzle 18 horizontally between a processing position where the phosphoric acid aqueous solution discharged from the phosphoric acid nozzle 18 is supplied to an upper surface of the substrate W and a retracted position where the phosphoric acid nozzle 18 is retracted to the periphery of the substrate W in a plan view.

As shown in FIG. 1, the processing unit 2 includes an SC1 nozzle 24 that discharges SC1 (a mixed solution containing $NH_4OH$ and $H_2O_2$) toward the substrate W held by the spin chuck 5, an SC1 piping 25 that supplies the SC1 to the SC1 nozzle 24, an SC1 valve 26 that switches between supplying and stopping the supply of SC1 from the SC1 piping 25 to the SC1 nozzle 24, and a nozzle moving unit 27 that moves the SC1 nozzle 24 horizontally and vertically. When the SC1 valve 26 is opened, the SC1 supplied from the SC1 piping 25 to the SC1 nozzle 24 is discharged from the SC1 nozzle 24. The nozzle moving unit 27 moves the SC1 nozzle 24 horizontally between a processing position where the SC1 discharged from the SC1 nozzle 24 is supplied to the upper surface of the substrate W and a retracted position where the SC1 nozzle 24 is retracted to the periphery of the substrate W in a plan view.

As shown in FIG. 1, the processing unit 2 includes a rinse liquid nozzle 28 that discharges a rinse liquid toward the substrate W held by the spin chuck 5, a rinse liquid piping 29 that supplies the rinse liquid to the rinse liquid nozzle 28, and a rinse liquid valve 30 that switches between supplying and stopping the supply of the rinse liquid from the rinse liquid piping 29 to the rinse liquid nozzle 28.

The rinse liquid nozzle 28 is a fixed nozzle that discharges the rinse liquid with a discharge port of the rinse liquid nozzle 28 being kept still. The processing unit 2 may include a nozzle moving unit that moves the rinse liquid nozzle 28 to move the liquid landing position of the rinse liquid with respect to the upper surface of the substrate W. When the rinse liquid valve 30 is opened, the rinse liquid supplied from the rinse liquid piping 29 to the rinse liquid nozzle 28 is discharged from the rinse liquid nozzle 28 toward an upper surface central portion of the substrate W.

As shown in FIG. 1, the processing unit 2 includes a rinse liquid nozzle 38 that discharges a rinse liquid toward the substrate W held by the spin chuck 5, a rinse liquid piping 39 that supplies the rinse liquid to the rinse liquid nozzle 38, a rinse liquid valve 40 that switches between supplying and stopping the supply of the rinse liquid from the rinse liquid piping 39 to the rinse liquid nozzle 38, and a temperature controller 41 that raises the temperature of the rinse liquid supplied to the rinse liquid nozzle 38 to a temperature higher than room temperature.

The rinse liquid nozzle 38 is a fixed nozzle that discharges the rinse liquid with a discharge port of the rinse liquid nozzle 38 being kept still. The processing unit 2 may include a nozzle moving unit that moves the rinse liquid nozzle 38 to move the liquid landing position of the rinse liquid with respect to the upper surface of the substrate W. When the rinse liquid valve 40 is opened, the rinse liquid that is controlled to be of a predetermined temperature (e.g., 40 to 90° C.) higher than room temperature by the temperature controller 41 is supplied from the rinse liquid piping 39 to the rinse liquid nozzle 38 and is discharged from the rinse liquid nozzle 38 toward the upper surface central portion of the substrate W.

The rinse liquid that is discharged from the rinse liquid nozzle 28 and the rinse liquid nozzle 38 is, for example, pure water (deionized water). The rinse liquid is not limited to pure water, but may be carbonated water, electrolyzed ionic water, hydrogen water, ozone water, IPA (isopropyl alcohol), or hydrochloric acid water of a dilute concentration (e.g., about 10 to 100 ppm). Also, the same type of rinse liquid may be discharged from the rinse liquid nozzle 28 and the rinse liquid nozzle 38 or different types of rinse liquids may be discharged from the rinse liquid nozzle 28 and the rinse liquid nozzle 38.

As shown in FIG. 1, the processing unit 2 includes the infrared heater 31 that irradiates infrared rays onto the substrate W, a heater arm 32 having the infrared heater 31 mounted on a tip portion thereof, and a heater moving unit 33 that moves the heater arm 32. The infrared heater 31 includes an infrared lamp 34 that emits the infrared rays and a lamp housing 35 housing the infrared lamp 34. The infrared lamp 34 is disposed within the lamp housing 35.

Figure 2:
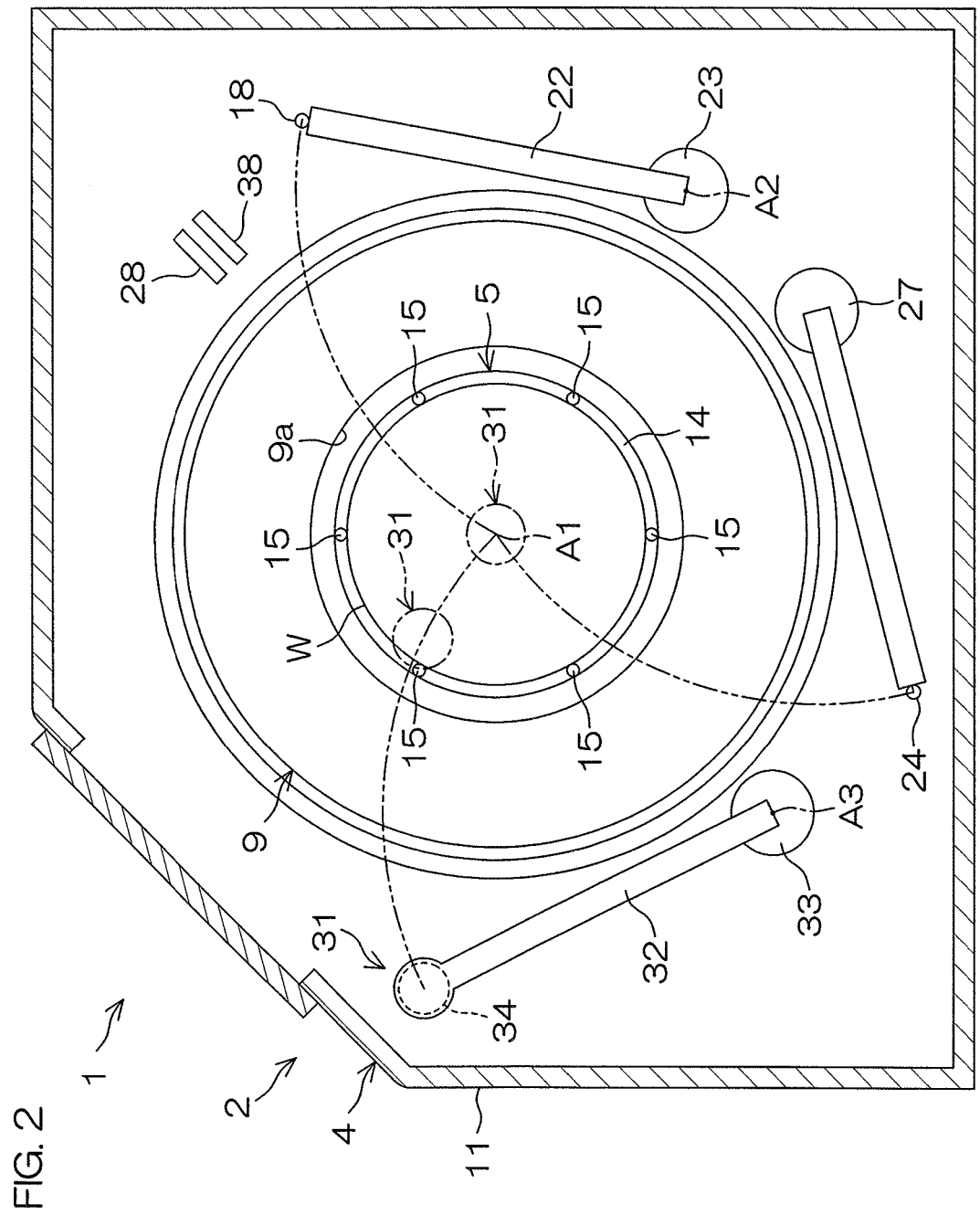
FIG. 2 is a schematic view of a section of the processing unit taken along line II-II in FIG. 1.

As shown in FIG. 2, the lamp housing 35 is smaller than the substrate W in a plan view. Accordingly, the infrared heater 31 disposed within the lamp housing 35 is also smaller than the substrate W in a plan view. The infrared lamp 34 and the lamp housing 35 are mounted on the heater arm 32. Accordingly, the infrared lamp 34 and the lamp housing 35 move together with the heater arm 32.

The infrared lamp 34 includes a filament and a quartz tube housing the filament. The infrared lamp 34 (e.g., halogen lamp) may be a carbon heater or another type of heating element. At least a portion of the lamp housing 35 is formed of a material having optical transparency and heat resistance, such as quartz. The infrared lamp 34 emits light that includes infrared rays. The light that includes the infrared rays is transmitted through the lamp housing 35 to be radiated from an outer surface of the lamp housing 35 or heats the lamp housing 35 to cause radiant light to be radiated from its outer surface.

As shown in FIG. 1, the lamp housing 35 has a bottom wall parallel to the upper surface of the substrate W. The infrared lamp 34 is disposed above the bottom wall. The lower surface of the bottom wall includes a substrate facing surface that is flat and parallel to the upper surface of the substrate W. In a state where the infrared heater 31 is disposed above the substrate W, the substrate facing surface of the lamp housing 35 faces the upper surface of the substrate W in the up/down direction across an interval. When the infrared lamp 34 emits the infrared rays in this state, the infrared rays are transmitted through the substrate facing surface of the lamp housing 35 and are irradiated onto the upper surface of the substrate W. The substrate facing surface has, for example, a circular shape with a diameter smaller than the radius of the substrate W. The substrate facing surface is not limited to having a circular shape, and may have a rectangular shape with a longitudinal length not less than the radius of the substrate W or a shape other than circular or rectangular.

As shown in FIG. 1, the heater moving unit 33 holds the infrared heater 31 at a predetermined height. The heater moving unit 33 moves the infrared heater 31 vertically. Further, the heater moving unit 33 swings the heater arm 32 around a swing axis A3, extending in the up/down direction at the periphery of the spin chuck 5, to move the infrared heater 31 horizontally. This causes a heated region (a portion within the upper surface of the substrate W), heated by irradiation of infrared rays and other light, to move within the upper surface of the substrate W. As shown in FIG. 2, the heater moving unit 33 moves the tip portion of the heater arm 32 horizontally along an arcuate trajectory passing through the center of the substrate W in a plan view. Accordingly, the infrared heater 31 moves within a horizontal plane including a space above the spin chuck 5.

The infrared rays from the infrared heater 31 are irradiated onto the heated region within the upper surface of the substrate W. In the state where the infrared heater 31 is emitting light, the controller 3 makes the heater moving unit 33 swing the infrared heater 31 around the swing axis A3 while making the spin chuck 5 rotate the substrate W. The upper surface of the substrate W is thereby scanned by the heated region of the infrared heater 31. As a result, the infrared rays and other light are absorbed by at least one of the upper surface of the substrate W and the processing liquid film held on the upper surface of the substrate W and radiant heat is transferred from the infrared lamp 34 to the substrate W. Therefore, when the infrared lamp 34 emits light in a state where a liquid, such as the processing liquid, etc., is held on the substrate W, the temperature of the substrate W rises and accordingly, the temperature of the liquid on the substrate W also rises. Alternatively, the liquid on the substrate W is itself heated to rise in temperature.

Figure 3:
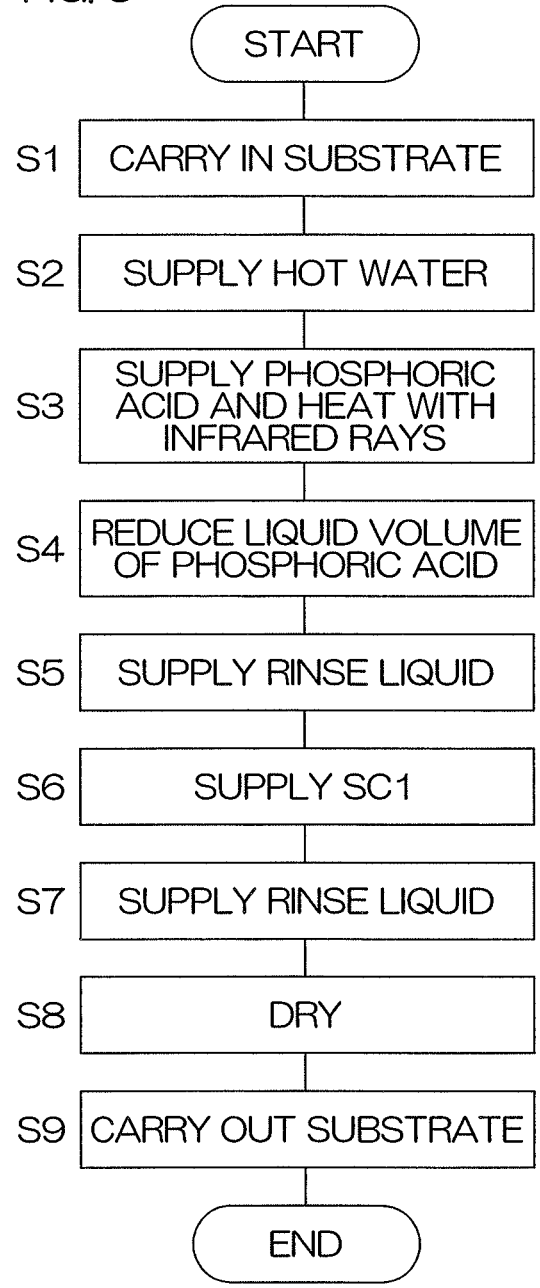
FIG. 3 is a process flowchart for describing an example of substrate processing performed by the processing unit.

FIG. 3 is a process flowchart for describing an example of processing of the substrate W that is performed by the processing unit 2. FIG. 1 and FIG. 2 shall be referenced in the description below. FIG. 3 shall be referenced where appropriate.

An example of selective etching shall now be described in which a phosphoric acid aqueous solution is supplied to a front surface (device forming surface) of a substrate W (silicon wafer), having an LP-SiN (low pressure-silicon nitride) thin film, as an example of a silicon nitride film, and an LP-TEOS (low pressure-tetraethyl orthosilicate) thin film, as an example of a silicon oxide film, formed on a surface layer, and the LP-SiN thin film is thereby etched selectively. The silicon oxide film is not limited to a TEOS thin film, and may be a thermal oxide film or a silicate glass-based oxide film.

When the substrate W is to be processed by the processing unit 2, a carry-in step (step S1 in FIG. 3) of carrying the substrate W into the chamber 4 is performed.

Specifically, in a state where all of the nozzles are retracted from above the spin chuck 5, the controller 3 makes a hand of the transfer robot (not shown), which holds the substrate W, enter the chamber 4. The controller 3 then makes the transfer robot place the substrate W on the spin chuck 5 and makes the spin chuck 5 hold the substrate W. Subsequently, the controller 3 makes the hand of the transfer robot retract from inside the chamber 4. Thereafter, the controller 3 makes the spin chuck 5 rotate the substrate W.

Thereafter, a pre-wetting step (step S2 in FIG. 3) of supplying pure water, which is an example of a pre-wetting liquid, to the substrate W is performed.

Specifically, the controller 3 opens the rinse liquid valve 40 to make the pure water (may also be referred to hereinafter as "hot water"), which is controlled to be of a temperature (e.g., 60° C.) that is higher than room temperature by the temperature controller 41, be discharged by the rinse liquid nozzle 38 toward the upper surface central portion of the rotating substrate W. The hot water discharged from the rinse liquid nozzle 38 lands on the upper surface of the substrate W and thereafter flows outward along the upper surface of the substrate W. The hot water is thus supplied to the entire upper surface of the substrate W and a liquid film of hot water that covers the entire upper surface of the substrate W is formed on the substrate W. When a predetermined time elapses after the rinse liquid valve 40 is opened, the controller 3 closes the rinse liquid valve 40 to stop the discharge of pure water.

Thereafter, a phosphoric acid processing step (step S3 in FIG. 3) of supplying the phosphoric acid aqueous solution, which is an example of an etching liquid, to the substrate W to perform an etching process on the front surface of the substrate W while forming a liquid film of the phosphoric acid aqueous solution of high temperature on the front surface of the substrate W and a heating step (step S3 in FIG. 3) of heating the phosphoric acid aqueous solution on the substrate W are performed in parallel.

In regard to the phosphoric acid processing step, the controller 3 controls the nozzle moving unit 23 to move the phosphoric acid nozzle 18 from the retracted position to the processing position. The phosphoric acid nozzle 18 is thereby disposed above the substrate W. Thereafter, the controller 3 opens the phosphoric acid valve 20. The phosphoric acid aqueous solution, having a temperature, for example, of 160 to 195° C. and silicon concentration lower than the saturation concentration, is thereby discharged from the phosphoric acid nozzle 18 toward the upper surface of the rotating substrate W. In this state, the controller 3 may make the nozzle moving unit 23 move the phosphoric acid nozzle 18 so that the liquid landing position of the phosphoric acid aqueous solution with respect to the upper surface of the substrate W moves between the central portion and a peripheral edge portion or may control the nozzle moving unit 23 so that the liquid landing position of the phosphoric acid aqueous solution is kept still within the upper surface of the substrate W. After elapse of a predetermined time from the opening of the phosphoric acid valve 20, the controller 3 closes the phosphoric acid valve 20 to stop the discharge of the phosphoric acid aqueous solution from the phosphoric acid nozzle 18.

The phosphoric acid aqueous solution discharged from the phosphoric acid nozzle 18 lands on the upper surface of the substrate W that is covered with the hot water liquid film and thereafter flows outward along the upper surface of the substrate W. The hot water liquid film on the substrate W is thus replaced with a liquid film of the phosphoric acid aqueous solution that covers the entire upper surface of the substrate W. The upper surface of the substrate W is thereby etched and the silicon nitride film is removed selectively. The phosphoric acid aqueous solution liquid film has a silicon concentration lower than the saturation concentration. Also, the phosphoric acid aqueous solution that splashes to the periphery of the substrate W is guided via the cup 9 to a recovery apparatus. The phosphoric acid aqueous solution that has been guided to the recovery apparatus is supplied to the substrate W again. The usage volume of the phosphoric acid aqueous solution is thereby reduced.

In regard to the heating step, the controller 3 makes the infrared heater 31 start emitting light. Thereafter, the controller 3 makes the heater moving unit 33 move the infrared heater 31 from the retracted position to the processing position. In this process, the controller 3 may make the substrate facing surface of infrared heater 31 contact the phosphoric acid aqueous solution liquid film on the substrate W or may make the substrate facing surface of infrared heater 31 be separated from the phosphoric acid aqueous solution liquid film on the substrate W by just a predetermined distance. Also, the controller 3 may make the heater moving unit 33 move the infrared heater 31 horizontally so that a region of irradiation of the infrared rays with respect to the upper surface of the substrate W moves between the central portion and the peripheral edge portion or may control the heater moving unit 33 so that the infrared ray irradiation region is kept still within the upper surface of the substrate W. After the heating of the substrate W by the infrared heater 31 has been performed for a predetermined time, the controller 3 makes the infrared heater 31 retract from above the substrate W. Thereafter, the controller 3 stops the light emission by the infrared heater 31.

In a case where the infrared ray irradiation position with respect to the upper surface of the substrate W is moved back and forth between the central portion and the peripheral edge portion, the substrate W is heated uniformly. The phosphoric acid aqueous solution liquid film that covers the entire upper surface of the substrate W is thus also heated uniformly. The temperature of heating of the substrate W by the infrared heater 31 is set to a temperature (of not less than 100° C., for example, a predetermined temperature in a range of 140° C. to 195° C.) close to the boiling point of the phosphoric acid aqueous solution at its current concentration. The phosphoric acid aqueous solution on the substrate W is thus heated to the boiling point at its current concentration and is maintained in the boiling state. Especially when the temperature of heating of the substrate W by the infrared heater 31 is set to a higher temperature than the boiling point of the phosphoric acid aqueous solution at its current concentration, the temperature of the interface of the substrate W and the phosphoric acid aqueous solution is maintained at a temperature higher than the boiling point and the etching of the substrate W is accelerated.

Thereafter, a liquid volume reducing step (step S4 in FIG. 3) of reducing the volume of the phosphoric acid aqueous solution on the substrate W is performed.

Specifically, the controller 3 makes the substrate W rotate at a predetermined rotation speed for a predetermined time in a state where the discharge of the phosphoric acid aqueous solution from the phosphoric acid nozzle 18 is stopped. A centrifugal force is applied to the phosphoric acid aqueous solution on the substrate W and therefore the phosphoric acid aqueous solution is expelled from the substrate W. The supplying of the phosphoric acid aqueous solution from the phosphoric acid nozzle 18 is stopped. The volume of the phosphoric acid aqueous solution on the substrate W is thus reduced. The thickness of the phosphoric acid aqueous solution liquid film is thus reduced. That is, the volume of the phosphoric acid aqueous solution on the substrate W is reduced in the state where the entire upper surface of the substrate W is covered with the phosphoric acid aqueous solution liquid film.

If the rotation speed of the substrate W in the phosphoric acid processing step (phosphoric acid processing speed) is 200 rpm, the rotation speed of the substrate W in the liquid volume reducing step (liquid volume reducing speed) is, for example, 200 rpm. The liquid volume reducing speed may be equal to the phosphoric acid processing speed or may be higher or lower than the phosphoric acid processing speed. Also, the time during which the substrate W is rotated at the liquid volume reducing speed (liquid volume reducing time) is, for example, 15 seconds.

Thereafter, a first rinse replacing step (step S5 in FIG. 3) of supplying pure water, which is an example of a rinse liquid, to the substrate W to replace the phosphoric acid aqueous solution on the front surface of the substrate W with the rinse liquid is performed.

Specifically, the controller 3 opens the rinse liquid valve 40 to make the rinse liquid nozzle 38 discharge hot water, for example, of 60° C., toward the upper surface central portion of the rotating substrate W. The hot water discharged from the rinse liquid nozzle 38 lands on the upper surface of the substrate W and thereafter flows outward along the upper surface of the substrate W. A portion of the phosphoric acid aqueous solution on the substrate W becomes mixed with the hot water supplied to the upper surface of the substrate W. Therefore at the beginning of supplying of hot water, a liquid film of hot water that contains the phosphoric acid aqueous solution is formed on the substrate W. The concentration of the phosphoric acid aqueous solution in the hot water is reduced with the elapse of time. Therefore, when a predetermined time elapses from the start of supplying of hot water, all or nearly all of the phosphoric acid aqueous solution is expelled from the substrate W and the phosphoric acid aqueous solution liquid film on the substrate W is replaced with a hot water liquid film that covers the entire upper surface of the substrate W. When the predetermined time elapses after the rinse liquid valve 40 is opened, the controller 3 closes the rinse liquid valve 40 to stop the discharge of pure water.

Thereafter, a chemical liquid supplying step (step S6 in FIG. 3) of supplying the SC1, which is an example of a chemical liquid, to the substrate W is performed.

Specifically, the controller 3 controls the nozzle moving unit 27 to move the SC1 nozzle 24 from the retracted position to the processing position. After the SC1 nozzle 24 is disposed above the substrate W, the controller 3 opens the SC1 valve 26 to make the SC1 nozzle 24 discharge the SC1 toward the upper surface of the rotating substrate W. In this state, the controller 3 controls the nozzle moving unit 27 to move the liquid landing position of the SC1 with respect to the upper surface of the substrate W back and forth between the central portion and the peripheral edge portion. When a predetermined time elapses after the SC1 valve 26 is opened, the controller 3 closes the SC1 valve 26 to stop the discharging of the SC1. The controller 3 then controls the nozzle moving unit 27 to retract the SC1 nozzle 24 from above the substrate W.

The SC1 discharged from the SC1 nozzle 24 lands on the upper surface of the substrate W and thereafter flows outward along the upper surface of the substrate W. Accordingly, the pure water on the substrate W is washed away outwardly by the SC1 and expelled to the periphery of the substrate W. The liquid film of pure water on the substrate W is thereby replaced with the liquid film of SC1 that covers the entire upper surface of the substrate W. Further, in the state where the substrate W is rotating, the controller 3 moves the liquid landing position of the SC1 with respect to the upper surface of the substrate W between the central portion and the peripheral edge portion, and therefore the liquid landing position of SC1 passes across the entire upper surface of the substrate W and scans the entire upper surface of the substrate W. The SC1 discharged from the SC1 nozzle 24 is thus sprayed directly over the entire upper surface of the substrate W so that the entire upper surface of the substrate W is processed uniformly.

Thereafter, a second rinse replacing step (step S7 in FIG. 3) of supplying pure water, which is an example of a rinse liquid, to the substrate W and replacing the SC1 liquid film on the substrate W with the pure water is performed.

Specifically, the controller 3 opens the rinse liquid valve 30 to make the rinse liquid nozzle 28 discharge pure water toward the upper surface central portion of the rotating substrate W. The SC1 on the substrate W is thereby washed away outwardly by the pure water and expelled to the periphery of the substrate W. The SC1 liquid film on the substrate W is thus replaced with a pure water liquid film that covers the entire upper surface of the substrate W. When a predetermined time elapses after the rinse liquid valve 30 is opened, the controller 3 closes the rinse liquid valve 30 to stop the discharge of pure water.

Thereafter, a drying step (step S8 in FIG. 4) of drying the substrate W is performed.

Specifically, the controller 3 accelerates the substrate W in a rotation direction by means of the spin chuck 5 and thereby makes the substrate W rotate at a rotation speed (e.g., 500 to 3000 rpm) higher than the rotation speed up to the second rinse replacing step. A large centrifugal force is thereby applied to the liquid on the substrate W so that the liquid adhering to the substrate W is spun off from the substrate W. The liquid is thus removed from the substrate W and hence the substrate W is dried. When a predetermined time elapses after the start of high-speed rotation of the substrate W, the controller 3 stops the rotation of the substrate W by the spin chuck 5.

Thereafter, a carry-out step (step S9 in FIG. 3) of carrying the substrate W out of the chamber 4 is performed.

Specifically, the controller 3 makes the holding of the substrate W by the spin chuck 5 be released. Thereafter, with all the nozzles being retracted from above the spin chuck 5, the controller 3 makes the hand of the transfer robot (not shown) enter the chamber 4. The controller 3 then makes the hand of the transfer robot hold the substrate W on the spin chuck 5. Thereafter, the controller 3 makes the hand of the transfer robot retract from inside the chamber 4. The processed substrate W is thereby carried out of the chamber 4.

Figure 4A:
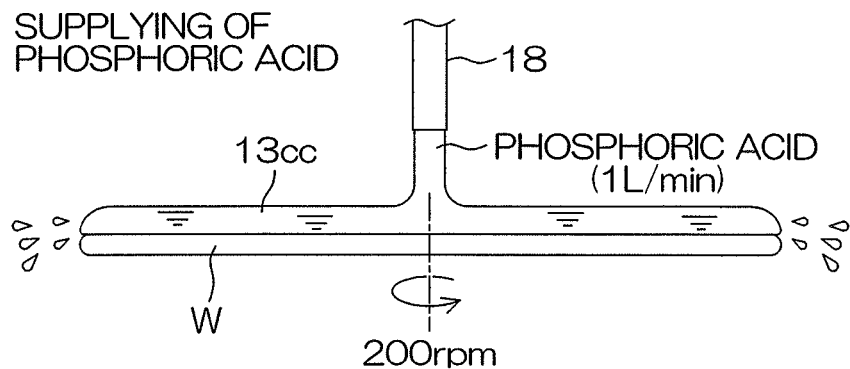
FIG. 4A is a schematic view of the state of a substrate during execution of a phosphoric acid processing step.
Figure 4B:
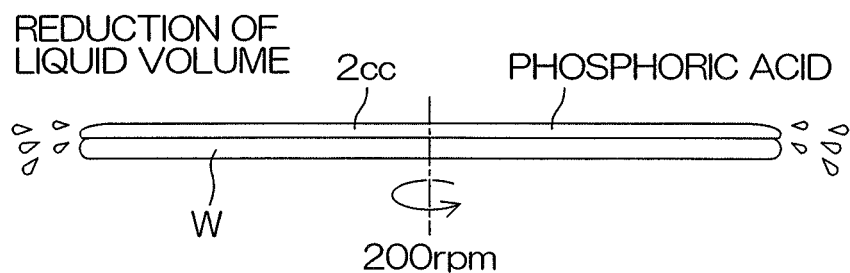
FIG. 4B is a schematic view of the state of the substrate during execution of a liquid volume reducing step.
Figure 4C:
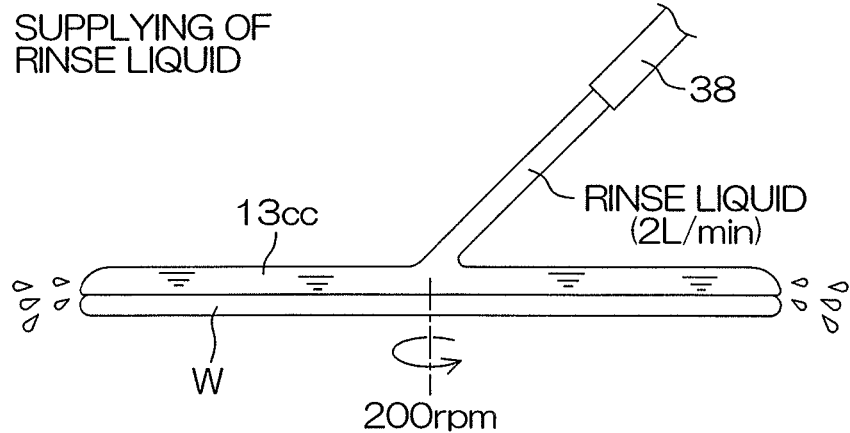
FIG. 4C is a schematic view of the state of the substrate during execution of a first rinse replacing step.
Figures 5, 6:
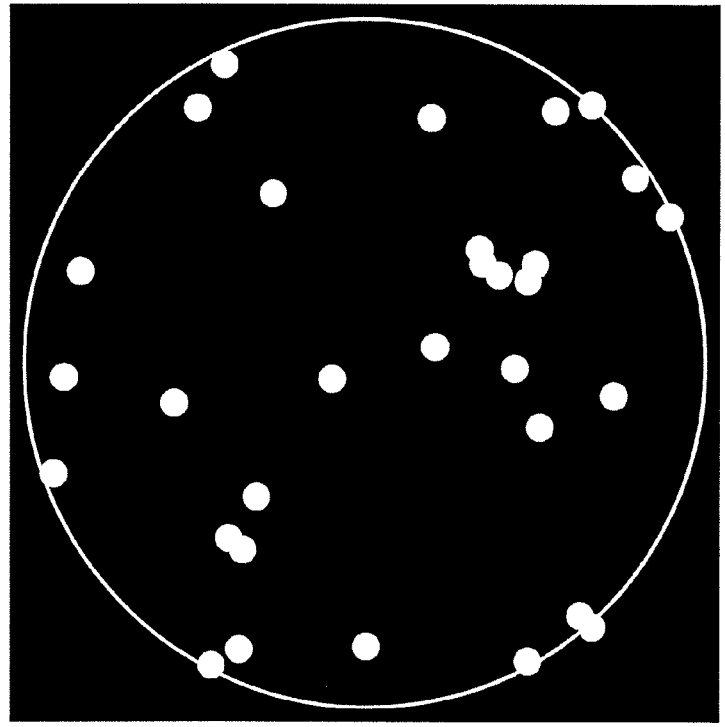
FIG. 5 is a table of the liquid volume, etc., in the respective steps of the phosphoric acid processing step, the liquid volume reducing step, and the first rinse replacing step.
FIG. 6 is a diagram of measurement results of measuring the number and positions of particles attached to an upper surface of a substrate that has been dried after being supplied with pure water at room temperature following reduction of the volume of a phosphoric acid aqueous solution.

FIG. 4A, FIG. 4B, and FIG. 4C are schematic views of the state of the substrate W during execution of the phosphoric acid processing step, the liquid volume reducing step, and the first rinse replacing step, respectively. FIG. 5 is a table of the liquid volume, etc., in the respective steps of the phosphoric acid processing step, the liquid volume reducing step, and the first rinse replacing step.

As shown in FIG. 4A, if it is assumed that when a phosphoric acid aqueous solution is supplied at a flow rate of 1 L/min to the upper surface of a substrate W with a diameter of 300 mm while rotating the substrate W at a rotation speed of 200 rpm, the thickness of the phosphoric acid aqueous solution liquid film is 180 μm at all locations, the substrate W holds approximately 13 cc (12.700 cc) of the phosphoric acid aqueous solution liquid film thereon according to the calculation formula: "$\pi \times$(radius of the substrate W)$^2 \times$liquid film thickness." The liquid temperature of the phosphoric acid aqueous solution liquid film is 170° C. and the silicon concentration is 40 ppm. As can be understood from FIG. 7 and FIG. 8, the silicon concentration in this state is lower than the saturation concentration.

As shown in FIG. 4B, when, after the entire upper surface of the substrate W is covered with the phosphoric acid aqueous solution liquid film, the supplying of the phosphoric acid aqueous solution is stopped while maintaining the rotation speed of the substrate W at 200 rpm, approximately 11 cc of the phosphoric acid aqueous solution are expelled from the substrate W and approximately 2 cc of the phosphoric acid aqueous solution remain on the substrate W 15 seconds after the supplying of the phosphoric acid aqueous solution is stopped.

As shown in FIG. 4C, if it is assumed that when hot water is supplied to the upper surface of the substrate W at a flow rate of 2 L/min while maintaining the rotation speed of the substrate W at 200 rpm after the volume of the phosphoric acid aqueous solution on the substrate W is reduced, the liquid film thickness of the hot water is 187 μm at all locations, the substrate W holds approximately 13 cc (13.200 cc) of the hot water thereon according to the abovementioned calculation formula.

Approximately 2 cc of the phosphoric acid aqueous solution remain on substrate W 15 seconds after the supplying of the phosphoric acid aqueous solution is stopped. According to the calculation formula: "volume of phosphoric acid aqueous solution (2 cc$\times 10^{-6}$)$\times$density of the phosphoric acid aqueous solution (1.62$\times 10^6$ g/m$^3$)$\times$concentration of silicon (40 ppm$\times 10^{-6}$)," if the concentration of silicon in the phosphoric acid aqueous solution is 40 ppm, 0.0001296 g (see FIG. 5) of silicon remain on the substrate W 15 seconds after the supplying of the phosphoric acid aqueous solution is stopped (after the end of the liquid volume reducing step).

If it is assumed that 2 cc of the phosphoric acid aqueous solution and 13.2 cc of the hot water become mixed on the substrate W, the concentration of silicon in the liquid on the substrate W is approximately 7.883 ppm (see FIG. 5) according to the calculation formula: "mass of silicon (0.0001296 g)/{volume of the phosphoric acid aqueous solution (2 cc×10$^{-6}$)×density of the phosphoric acid aqueous solution (1.62×10$^6$ g/m$^3$)+volume of the hot water (13.2 cc×10$^{-6}$)×density of the hot water (1.00×10$^6$ g/m$^3$)}."

As indicated in the column of the liquid volume reducing step in FIG. 5, if after supplying the phosphoric acid aqueous solution with the silicon concentration of 40 ppm and the temperature of 170° C. to the substrate W, the volume of the phosphoric acid aqueous solution is reduced, the temperature of the phosphoric acid aqueous solution on the substrate W is approximately 120° C. and the concentration of silicon in the phosphoric acid aqueous solution on the substrate W is 40 ppm. As can be understood from FIG. 7 and FIG. 8, the silicon concentration in this state is not less than the saturation concentration.

Although not illustrated, if after supplying the phosphoric acid aqueous solution with the silicon concentration of 40 ppm and the temperature of 180° C. to the substrate W, the volume of the phosphoric acid aqueous solution is reduced, the temperature of the phosphoric acid aqueous solution on the substrate W is approximately 130° C. and the concentration of silicon in the phosphoric acid aqueous solution on the substrate W is 40 ppm. As can be understood from FIG. 7 and FIG. 8, the silicon concentration in this state is lower than the saturation concentration.

If pure water with a temperature of 25° C. is supplied to the substrate W in a state where 2 cc of the phosphoric acid aqueous solution of approximately 120° C. remains on the substrate W, the temperature of the liquid (the phosphoric acid aqueous solution diluted by the pure water) on the substrate W at the point at which the pure water has spread across the entire upper surface of the substrate W is approximately 25° C. and the concentration of silicon in the liquid (the phosphoric acid aqueous solution diluted by the pure water) on the substrate W is approximately 8 ppm as indicated in the column of the rinse replacing step in FIG. 5.

When after supplying the phosphoric acid aqueous solution to the substrate W, pure water of a lower temperature than the phosphoric acid aqueous solution is supplied to the substrate W, the temperature of the phosphoric acid aqueous solution on the substrate W decreases and the concentration of silicon in the phosphoric acid aqueous solution may become not less than the saturation concentration and a portion of the silicon contained in the phosphoric acid aqueous solution may precipitate. However, the amount of silicon contained in the phosphoric acid aqueous solution on the substrate W is reduced before supplying the pure water and therefore the amount of silicon that precipitates from the phosphoric acid aqueous solution on the substrate W is low.

FIG. 6 is a diagram of measurement results of measuring the number and positions of particles of diameter not less than 32 nm that are attached to the upper surface of the substrate W that has been dried after being supplied with pure water at room temperature following reduction of the volume of the phosphoric acid aqueous solution. In FIG. 6, a white circle indicates an outline of the substrate W and white dots inside the circle indicate particles. The size of a dot is unrelated to the size of a particle.

As shown in FIG. 6, in the case where the volume of the phosphoric acid aqueous solution was reduced, the number of particles of diameter not less than 32 nm was 33. On the other hand, in a case where the volume of the phosphoric acid aqueous solution was not reduced, the number of particles of diameter not less than 32 nm was not less than a thousand. It was thus confirmed that the number of particles can be reduced significantly by reducing the volume of the phosphoric acid aqueous solution before supplying pure water.

As mentioned above, when pure water with a temperature of 25° C. is supplied to the substrate W with 2 cc of the phosphoric acid aqueous solution of approximately 120° C. remaining on the substrate W, the temperature of the liquid (the phosphoric acid aqueous solution diluted by the pure water) on the substrate W at the point at which the pure water has spread across the entire upper surface of the substrate W was approximately 25° C. That is, when pure water is supplied after the volume of the phosphoric acid aqueous solution has been reduced, the temperature of the phosphoric acid aqueous solution on the substrate W becomes approximately equal to the temperature of the pure water supplied to the substrate W.

If pure water with a temperature of 60° C. is supplied to the substrate W in a state where 2 cc of the phosphoric acid aqueous solution of approximately 120° C. remains on the substrate W, the temperature of the liquid (the phosphoric acid aqueous solution diluted by the pure water) on the substrate W at the point at which the pure water has spread across the entire upper surface of the substrate W is approximately 60° C. and the concentration of silicon in the liquid (the phosphoric acid aqueous solution diluted by the pure water) on the substrate W is 8 ppm (see FIG. 5). As can be understood from FIG. 7 and FIG. 8, the silicon concentration in this state is lower than the saturation concentration.

The concentration of silicon in the liquid (the phosphoric acid aqueous solution diluted by the pure water) on the substrate W when the pure water is being supplied to the substrate W is highest at the beginning of supplying of the pure water and becomes reduced with the elapse of time. Eventually, the silicon concentration becomes zero or substantially zero. Therefore, if the saturation concentration of silicon at the beginning of supplying of the pure water is made higher than the silicon concentration, the precipitation of silicon can be suppressed or prevented when the pure water is being supplied to the substrate W. The degree of cleanliness of the substrate W can thereby be increased.

As described above, with the present preferred embodiment, the phosphoric acid aqueous solution with a silicon concentration lower than the saturation concentration is supplied to the upper surface of the horizontally-held substrate W. The phosphoric acid aqueous solution is thereafter expelled from the substrate W. The volume of the phosphoric acid aqueous solution on the substrate W is thereby reduced. Therefore the amount of silicon remaining on the upper surface of the substrate W is also reduced. Pure water, which is an example of the rinse liquid, is supplied to the upper surface of the substrate W, in the state where the upper surface of the substrate W is covered with the phosphoric acid aqueous solution, after the volume of the phosphoric acid aqueous solution on the substrate W has been reduced. The phosphoric acid aqueous solution on the substrate W is thereby rinsed off by the pure water.

When in the state where the upper surface of the substrate W is covered with the phosphoric acid aqueous solution, pure water of lower temperature than the phosphoric acid aqueous solution is supplied to the substrate W, the temperature of the phosphoric acid aqueous solution on the substrate W decreases. The concentration of silicon in the phosphoric acid aqueous solution may thus become not less than the saturation concentration and a portion of the silicon contained in the phosphoric acid aqueous solution may precipitate. However, the amount of silicon contained in the phosphoric acid aqueous solution on the substrate W is reduced before the supplying of the pure water and therefore even if silicon precipitates, the amount thereof is small.

Contamination of the substrate W by precipitated matter that includes silicon can thus be suppressed or prevented.

Also with the present preferred embodiment, pure water of higher temperature than room temperature is supplied to the upper surface of the substrate W that is covered with the phosphoric acid aqueous solution. When in the state where the upper surface of the substrate W is covered with the phosphoric acid aqueous solution, pure water of lower temperature than the phosphoric acid aqueous solution is supplied to the substrate W, the temperature of the phosphoric acid aqueous solution on the substrate W decreases. However, the temperature of the pure water is higher than room temperature and therefore the amount of temperature decrease of the phosphoric acid aqueous solution is reduced. The amount of decrease of the saturation concentration of silicon is thereby reduced and the precipitation of silicon from the phosphoric acid aqueous solution due to the supplying of the pure water can thus be suppressed or prevented.

Also with the present preferred embodiment, the phosphoric acid aqueous solution with the silicon concentration lower than the saturation concentration is supplied to the upper surface of the substrate W. Thereafter, the phosphoric acid aqueous solution is expelled from the substrate W. The concentration of silicon in the phosphoric acid aqueous solution on the substrate W is maintained lower than the saturation concentration from the point at which the supplying of the phosphoric acid aqueous solution is started to the point at which the expelling of the phosphoric acid aqueous solution ends. Contamination of the substrate W due to precipitation of silicon can thus be suppressed or prevented during this period.

Also with the present preferred embodiment, the phosphoric acid aqueous solution with the silicon concentration lower than the saturation concentration is supplied to the upper surface of the substrate W. The pure water is supplied to the upper surface of the substrate W after the volume of the phosphoric acid aqueous solution on the substrate W has been reduced. The concentration of silicon in the phosphoric acid aqueous solution on the substrate W is maintained lower than the saturation concentration from the point at which the supplying of the phosphoric acid aqueous solution is started to the point at which the supplying of the pure water ends. Contamination of the substrate W due to precipitation of silicon can thus be suppressed or prevented during this period.

Also with the present preferred embodiment, the phosphoric acid aqueous solution liquid film that covers the entire upper surface of the substrate W is formed. Thereafter, the state in which the entire upper surface of the substrate W is covered with the phosphoric acid aqueous solution is maintained until the expelling of the phosphoric acid aqueous solution ends. That is, When the phosphoric acid aqueous solution liquid film that covers the entire upper surface of the substrate W becomes reduced in thickness and a portion of the substrate W upper surface becomes exposed, a processing fault, such as attachment of particles, forming of a watermark, etc., may occur on the substrate W. Therefore by maintaining the state in which the entire upper surface of the substrate W is covered with the phosphoric acid aqueous solution, the occurrence of a processing defect can be suppressed or prevented.

Also with the present preferred embodiment, the phosphoric acid aqueous solution is supplied to the upper surface of the substrate W that is covered with pure water, which is an example of the pre-wetting liquid. The phosphoric acid aqueous solution becomes mixed with the pure water on the substrate W. That is, the phosphoric acid aqueous solution that lands on the substrate W at the start of supplying of the phosphoric acid aqueous solution is diluted by the pure water. The concentration of silicon is thereby decreased. Further, the temperature of the pure water is higher than room temperature and therefore the amount of temperature decrease of the phosphoric acid aqueous solution that lands on the substrate W at the start of supplying of the phosphoric acid aqueous solution is reduced. Therefore, even if the saturation concentration of silicon decreases due to temperature decrease of the phosphoric acid aqueous solution, the concentration of silicon is unlikely to become not less than the saturation concentration. The precipitation of silicon can thus be suppressed or prevented. Or, the amount of precipitation of silicon can be reduced.

Also with the present preferred embodiment, the phosphoric acid aqueous solution with the temperature being at or close to the boiling point is supplied to the upper surface of the substrate W. The boiling point of the phosphoric acid aqueous solution is higher than the boiling point of pure water, and therefore even if pure water that is heated close to the boiling point is supplied to the substrate W, the temperature of the phosphoric acid aqueous solution on the substrate W decreases. Even in this case, the precipitation of silicon can be suppressed or prevented by reducing the volume of the phosphoric acid aqueous solution on the substrate W. Or, the precipitation amount of silicon can be reduced. Contamination of the substrate W by precipitated matter that includes silicon can thus be suppressed or prevented.

Other Embodiments

The present invention is not limited to the description of the above preferred embodiments and various modifications may be made within the scope of the present invention.

For example, although the case where the phosphoric acid aqueous solution on the substrate W is rinsed off with hot water in the first rinse replacing step was described, the phosphoric acid aqueous solution on the substrate Wmay be rinsed off by a rinse liquid other than hot water. For example, the phosphoric acid aqueous solution on the substrate W may be rinsed off with a mixed liquid of hydrogen peroxide solution and hot water at room temperature. Also, the temperature of the rinse liquid may be equal to room temperature or may be lower than room temperature.

Although the case where the volume of the phosphoric acid aqueous solution is reduced while covering the entire upper surface of the substrate W with the phosphoric acid aqueous solution in the liquid volume reducing step was described, the upper surface of the substrate W may be partially exposed in the liquid volume reducing step.

Although the case where the upper surface of the substrate W is wetted with hot water before supplying the phosphoric acid aqueous solution to the substrate W was described, the upper surface of the substrate W may be wetted with a pre-wetting liquid other than hot water. The temperature of the pre-wetting liquid may be equal to room temperature or may be lower than room temperature. The phosphoric acid aqueous solution may be supplied to the upper surface of the substrate W that is dry.

Although the case where the phosphoric acid aqueous solution on the substrate W is heated by the infrared heater 31 in parallel to the phosphoric acid processing step was described, the phosphoric acid aqueous solution on the substrate W may be heated by a heat source other than the infrared heater 31. Also, the heating of the phosphoric acid aqueous solution by a heat source may be omitted.

Although the case where the substrate processing apparatus 1 is arranged to process disk-shaped substrates has been described above, the substrate processing apparatus 1 may be arranged to process polygonal substrates.

Although the case where the phosphoric acid aqueous solution liquid film is formed on the upper surface of the substrate W to process the upper surface of the substrate W, the phosphoric acid aqueous solution liquid film may be formed on a lower surface of the substrate W to process the lower surface of the substrate W as long as the lower surface is the front surface of the substrate W.

Although the case where the phosphoric acid aqueous solution that is heated close to the boiling point in advance is supplied to the substrate W to form the liquid film of the phosphoric acid aqueous solution close to the boiling point on the substrate W and perform etching was described, a phosphoric acid aqueous solution of lower temperature than the boiling point may be supplied to the substrate W to form a liquid film and this may be heated on the substrate W and raised closed to the boiling point in temperature.

Two or more of any of the arrangements described above may be combined.

The present application corresponds to Japanese Patent Application No. 2014-165258 filed on Aug. 14, 2014 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
   a phosphoric acid processing step that includes a step of supplying a phosphoric acid aqueous solution, which contains silicon, to a front surface of a substrate and processes the front surface of the substrate while forming a liquid film of the phosphoric acid aqueous solution having a silicon concentration lower than a saturation concentration of silicon;
   a liquid volume reducing step of reducing a volume of the phosphoric acid aqueous solution on the substrate, after the phosphoric acid processing step;
   a rinse step of supplying the front surface of the substrate with a rinse liquid having a temperature lower than that of the liquid film of the phosphoric acid aqueous solution supplied to the front surface of the substrate in the phosphoric acid processing step, and replacing the phosphoric acid aqueous solution on the front surface of the substrate with the rinse liquid, after the liquid volume reducing step;
   a first concentration maintaining step of maintaining a concentration of silicon contained in the liquid film of the phosphoric acid aqueous solution on the substrate at a concentration lower than the saturation concentration, until the liquid volume reducing step ends; and
   a second concentration maintaining step of maintaining a concentration of silicon contained in a liquid on the substrate at a concentration lower than the saturation concentration, until supplying of the rinse liquid ends in the rinse step.

2. The substrate processing method according to claim 1, wherein a temperature of the rinse liquid supplied to the front surface of the substrate in the rinse step is lower than that of the liquid film of the phosphoric acid aqueous solution supplied to the front surface of the substrate in the phosphoric acid processing step, and higher than a room temperature.

3. The substrate processing method according to claim 1, wherein
   the phosphoric acid processing step includes a step of forming a liquid film of the phosphoric acid aqueous solution covering the entire front surface of the substrate by supplying the phosphoric acid aqueous solution to the substrate, and
   the liquid volume reducing step is a step of reducing the volume of the phosphoric acid aqueous solution on the substrate while maintaining a state in which the entire front surface of the substrate is covered with the liquid film of the phosphoric acid aqueous solution.

4. The substrate processing method according to claim 1, further comprising a pre-wetting step of supplying a pre-wetting liquid to the front surface of the substrate before the phosphoric acid processing step, and
   the phosphoric acid processing step includes a step of supplying the phosphoric acid aqueous solution to the front surface of the substrate covered with the pre-wetting liquid at least partially.

5. The substrate processing method according to claim 4, wherein a temperature of the pre-wetting liquid supplied to the substrate in the pre-wetting step is higher than a room temperature.

6. The substrate processing method according to claim 1, wherein
   the phosphoric acid processing step includes a step of supplying the front surface of the substrate with the phosphoric acid aqueous solution having a temperature close to a boiling point of the phosphoric acid aqueous solution, and
   a boiling point of the rinse liquid supplied to the substrate in the rinse step is lower than the boiling point of the phosphoric acid aqueous solution supplied to the substrate in the phosphoric acid processing step.

7. The substrate processing method according to claim 1, further comprising a heating step of heating the phosphoric acid aqueous solution on the substrate, in parallel to the phosphoric acid processing step.

* * * * *